United States Patent [19]
Behbin

[11] Patent Number: 6,008,650
[45] Date of Patent: Dec. 28, 1999

[54] SLOTTED RF SHIELDS FOR NMR PROBES

[75] Inventor: Ali Behbin, San Jose, Calif.

[73] Assignee: Varian, Inc., Palo Alto, Calif.

[21] Appl. No.: 09/080,136

[22] Filed: May 15, 1998

[51] Int. Cl.[6] .................................................. G01V 3/00
[52] U.S. Cl. ............................................. 324/318; 324/321
[58] Field of Search ................................. 324/318, 322, 324/320, 321, 300, 301, 306, 307, 309

[56] References Cited

U.S. PATENT DOCUMENTS

| | | | |
|---|---|---|---|
| 4,641,097 | 2/1987 | Bottomley et al. | 324/318 |
| 4,641,098 | 2/1987 | Doty | 324/322 |
| 4,740,751 | 4/1988 | Misic et al. | 324/318 |
| 4,748,412 | 5/1988 | Yamamoto et al. | 324/318 |
| 4,875,013 | 10/1989 | Murakami et al. | 324/318 |
| 4,929,881 | 5/1990 | Yabusaki et al. | 324/318 |
| 5,192,911 | 3/1993 | Hill et al. | 324/322 |
| 5,929,639 | 7/1999 | Doty | 324/318 |

*Primary Examiner*—Louis Arana
*Attorney, Agent, or Firm*—Edward H. Berkowitz

[57] ABSTRACT

A double resonance NMR apparatus in accordance with the present invention comprises a first resonator, a slotted resonator, and a slotted Rf shield. The axial shield slots on the Rf shield are aligned with the axial resonator slots on the slotted resonator to provide increased penetration of the Rf field from the first resonator into the sample, thereby increasing the total magnetic energy deposited into the sample.

4 Claims, 2 Drawing Sheets

SLOTTED RF SHIELDS FOR NMR PROBES

FIELD OF THE INVENTION

The present invention relates to the field of nuclear magnetic resonance (NMR) and pertains particularly to radio frequency (Rf) shields for use in a double resonance NMR probe which allow more of the lower frequency Rf magnetic field to penetrate a sample.

BACKGROUND OF THE INVENTION

In a typical NMR experiment, a sample is placed in a uniform static magnetic field ($B_0$) and excited by a Rf magnetic field ($B_1$) applied in a direction orthogonal to the static magnetic field. An NMR probe holds the sample coaxially within a resonator (or coil), which generates the Rf magnetic field. The resonator also detects the resonance signal of the sample, which is delivered to a receiver circuit to obtain the NMR spectrum.

While the sample is within the resonator, ionic species in the sample tend to electrically couple to the resonator, which causes losses in the NMR signal. To prevent electric coupling of the sample to the resonator, a Rf shield 10a, 10b is placed inside the resonator 12, between the resonator and the sample (not shown), as FIG. 1 illustrates. The Rf shield comprises two conductive rings 10a, 10b, one of which is placed coaxially at each end of the resonator, but without extending into the Rf window 14 of the resonator. Generally, the Rf shield is made of a susceptibility compensated conductive material and can be encased in a dielectric material, such as quartz, such that the conductive rings capacitively couple with the resonator.

For double resonance NMR experiments, the probe comprises two resonators, with an inner resonator placed coaxially within an outer resonator such that the Rf magnetic fields generated by the two resonators within the probe are orthogonal to each other. Most commonly, one resonator is tuned to the frequency of proton ($^1H$) excitation, while the other resonator is tuned to a lower resonant frequency nuclide of interest (X).

To increase the penetration of the lower frequency Rf magnetic field into the sample, axial slots are made in the other resonator. FIG. 2 illustrates a double resonance NMR probe having the slotted resonator 22 within the lower frequency coil 20. The two axial slots 24a, 24b in the slotted resonator 20 are placed 180° from each other and 90° out of phase with the Rf window 26 of the slotted resonator. This arrangement permits greater penetration of lower frequency Rf field through the slotted resonator into the sample.

Lengthening of the axial slots allows for greater penetration of lower frequency Rf field into the sample, and also allows the lower frequency resonator to be lengthened, which desirably increases lower frequency Rf field homogeneity. However, lengthening the axial slots in the slotted resonator is not without limit. Lengthening of the axial slots would require an accompanying lengthening of the Rf window, and in most cases, such drastic changes to the geometry of the slotted resonator would result in a change in the self-resonance frequency of the resonator and so could not be tolerated.

It is known in prior art to employ in probe components, slots of various types and orientations to accomplish reduction of eddy currents, increased transparency to RF irradiation from an outer coil, and other desired results. Representative references are patents U.S. Pat. No. 4,641,098 to Doty; U.S. Pat. No. 5,192,911 to Hill and Cummings; U.S. Pat. No. 4,875,013 to Murakami, et al; U.S. Pat. No. 4,929,881 to Yabusaki, et al; and U.S. Pat. No. 4,748,412 to Yamamoto, et al.

SUMMARY OF THE INVENTION

An object of the present invention is to increase the penetration of the lower frequency Rf magnetic field into the sample without requiring further modifications to the slotted resonator.

Another object of the present invention is to permit greater lengthening of the lower frequency resonator, and thus greater homogeneity of the lower frequency Rf field, without sacrificing the total amount of magnetic energy into the sample.

In accordance with this invention, a double resonance NMR apparatus comprises a first resonator, a slotted resonator, and a slotted Rf shield. The slotted Rf shield has two axial slots placed at 180° from each other. The axial shield slots are aligned with the axial slots on the slotted resonator to provide increased penetration of the Rf field from the first resonator into the sample without requiring any changes to the geometry, or the self-resonance frequency, of the slotted resonator. Additionally, with the axial shield slots aligned with the axial resonator slots, the first resonator can be lengthened, thereby increasing the homogeneity of the Rf field it generates, while increasing the total magnetic energy deposited into the sample.

DETAILED DESCRIPTION OF THE INVENTION

Figure 1:
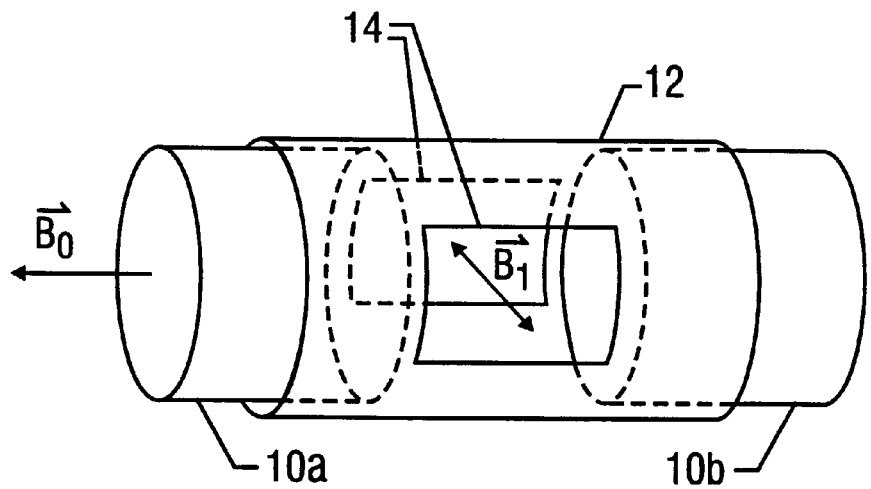
FIG. 1 shows an NMR probe for use in a single resonance experiment.
Figure 2:
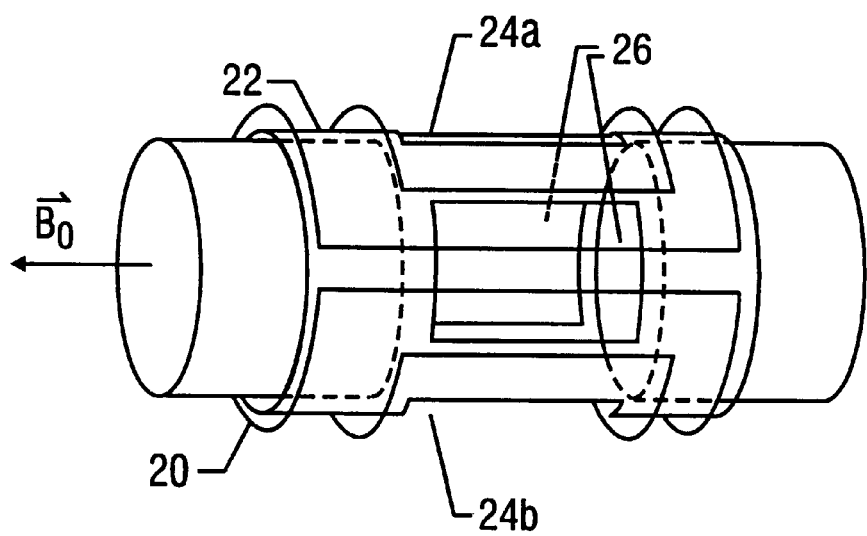
FIG. 2 shows an NMR probe for use in a double resonance experiment.
Figure 3:
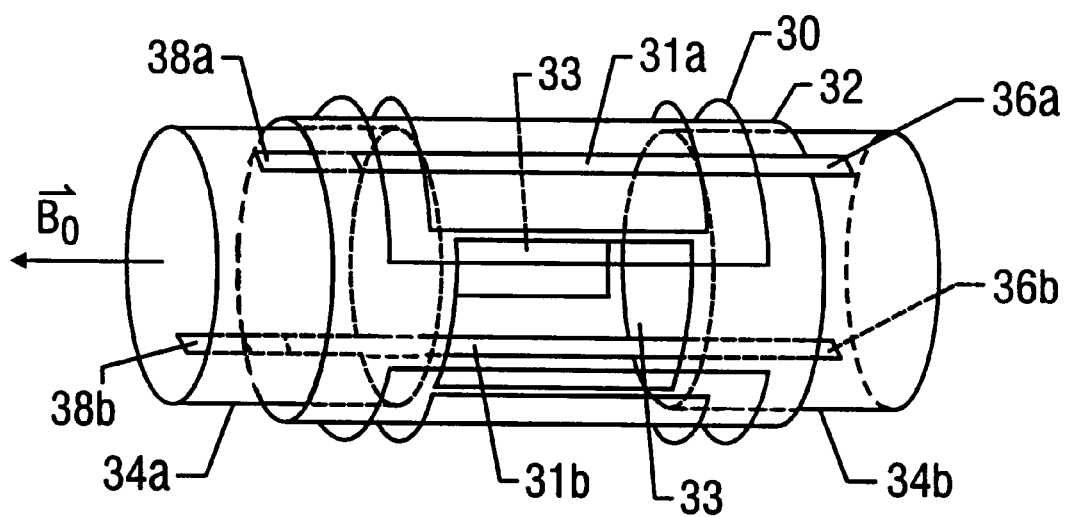
FIG. 3 illustrates one embodiment of an double resonance NMR probe in accordance with the present invention.

FIG. 3 shows one embodiment of the present invention. In this embodiment, a first resonator 30 is disposed coaxially around a slotted resonator 32. The slotted resonator has a pair of axial resonator slots 31a, 31b disposed at 180° from each other and 90° out of phase from the Rf window 33 of the slotted resonator.

Slotted Rf shields 34a, 34b arc placed inside the slotted resonator 32, between the slotted resonator and the sample (not shown). The Rf shield comprises a pair of conductive rings, and each ring has a pair of axial shield slots 36a, 36b and 38a, 38b extending from one end thereof and disposed at 180° from each other. Generally, the Rf shield is made of any susceptibility compensated conductive material and can be encased in a dielectric material, such as quartz, such that the conductive rings capacitively couple with the slotted resonator.

The axial shield slots 36a, 36b and 38a, 38b are aligned with the axial resonator slots 31a, 31b, as shown in FIG. 3, to provide increased penetration of the Rf field from the first resonator, and thus increased magnetic energy, into the sample. Using finite element three-dimensional programs to solve Maxwell's equations for the electromagnetic energy distribution into a volume of this geometry and keeping all other factors the same, the axial shield slots were shown to increase the total magnetic energy deposited into the sample volume coinciding with an 18 mm Rf window by 8% over the conventional unslotted Rf shields. The same finite element three-dimensional programs showed the axial shield slots increasing total magnetic energy into the total volume of a 60 mm length sample by 12.3% over conventional unslotted shields.

Figure 4:
FIG. 4 illustrates an alternative embodiment of the Rf shield in accordance with the present invention.

As shown in FIG. 3, the axial shield slots 36a, 36b and 38a, 38b extend only part-way along the side of each ring. Alternatively, the axial shield slots can extend along the entire length of each ring, as shown in FIG. 4.

The embodiments disclosed herein only illustrate the principles of this invention and are not meant to limit the present invention in any way. Other embodiments may be made in accordance with the present invention. For example, the first resonator may reside within the slotted resonator, with the slotted Rf shield between the slotted resonator and the first resonator and aligned with the axial resonator slots, and still provide increased penetration of the Rf field from the first resonator and increased total magnetic energy deposited into the sample. Many other modifications may be made without departing from the scope of the invention as defined in the claims.

What is claimed is:

1. A nuclear magnetic resonance (NMR) probe for double resonance NMR experiments, comprising:
   a first resonator;
   a slotted resonator having a pair of axial resonator slots disposed at 180° from each other, said slotted resonator being disposed coaxially within or around said first resonator; and
   a slotted shield having a pair of axial shield slots disposed at 180° from each other, said slotted shield being disposed coaxially within and at respective ends of said slotted resonator and positioned such that said pair of axial shield slots are aligned with said pair of axial resonator slots.

2. The nuclear magnetic resonance probe of claim 1, wherein said pair of axial shield slots extend from one end of said slotted shield to an opposite end of said slotted shield.

3. A nuclear magnetic resonance (NMR) apparatus for double resonance NMR experiments comprising:
   a first resonator;
   a slotted resonator having a pair of axial resonator slots disposed at 180° from each other, said slotted resonator being disposed coaxially within or around said first resonator; and
   a slotted shield having a pair of axial shield slots disposed at 180° from each other, said slotted shield being disposed coaxially within and at respective ends of said slotted resonator and positioned such that said pair of axial shield slots are aligned with said pair of axial resonator slots.

4. The nuclear magnetic resonance apparatus of claim 3, wherein said pair of axial shield slots extend from one end of said slotted shield to an opposite end of said slotted shield.

* * * * *